United States Patent [19]

Steinmetz et al.

[11] Patent Number: 4,498,727
[45] Date of Patent: Feb. 12, 1985

[54] ELECTRIC CONNECTING MEANS

[75] Inventors: Anthony Steinmetz; Jacobus J. Arnold; Fransiscus G. C. Verweg; Hendrik Groeneboer, all of Hilversum, Netherlands

[73] Assignee: U.S. Philips Corporation, New York, N.Y.

[21] Appl. No.: 241,267

[22] Filed: Mar. 6, 1981

[30] Foreign Application Priority Data

Mar. 17, 1980 [NL] Netherlands ............ 8001555

[51] Int. Cl.³ .................................... H01R 3/00
[52] U.S. Cl. ........................ 339/278 C; 252/512; 252/514; 252/515; 252/518; 252/513
[58] Field of Search ............ 252/500, 512, 513, 514, 252/515, 518, 506, 510, 511; 339/278 C, 278 R, 278 D

[56] References Cited

U.S. PATENT DOCUMENTS

| 3,853,382 | 12/1974 | Lazar | 339/278 C |
| 4,100,385 | 7/1978 | Wutz | 339/278 C |
| 4,106,842 | 8/1978 | Benasutti | 339/278 C |
| 4,138,604 | 2/1979 | Harmsen et al. | 339/278 C |
| 4,155,896 | 5/1979 | Rennier et al. | 252/512 |
| 4,183,611 | 1/1980 | Casciotti et al. | 339/278 C |
| 4,186,036 | 1/1980 | Elims et al. | 252/512 |
| 4,442,182 | 4/1984 | Chart | 339/278 C |

FOREIGN PATENT DOCUMENTS 363075 12/1931 United Kingdom .

Primary Examiner—Josephine L. Barr
Attorney, Agent, or Firm—Norman N. Spain

[57] ABSTRACT

Electric connecting means, such as connectors having a contact element which is coated with a considerably thinner (0.1-2 μm) noble metal layer than is customary and which is coated with a paste-like mixture comprising hard, electrically conducting particles.

2 Claims, 6 Drawing Figures

ELECTRIC CONNECTING MEANS

BACKGROUND OF THE INVENTION

The invention relates to electric connecting means employed in low-voltage electrical engineering, more particularly in electronics and telecommunications. These connecting means are usually multi-polar and may, for example, be multi-polar connectors and sockets, the connecting members of these connecting means have very frequently been made of a base metal, such as phosphor-bronze, having a 1 to 3 $\mu$m thick gold layer on the contact areas. The gold layer must be sufficiently resistant to wear, in order to be able to withstand 100 to 500 contacting operations, without local removal of the coating due to wear. This is accomplished by using alloyed gold in combination with base metal elements. A frequently used alloy is applied by means of a rolling operation to form a contact layer having a composition (in % by weight) of 70—Ag 20—Cu 10 or Au 70—Ag 24—Cu 6. However, an oxide layer forms at the surface since base metal elements are present in the alloy. This is disadvantageous, particularly at elevated temperatures, as then the oxide layer may become so thick that the contact resistance increases considerably. The formation of oxide layers on alloyed gold can be counteracted by applying a thin (for example 0.2 $\mu$m) layer of pure, unalloyed gold on top of the alloyed gold layer.

A different, known construction is a contact having a wear-resistant hard layer consisting of gold alloyed with, for example, cobalt, this layer having been deposited electrolytically.

However, gold is becoming rare and expensive so that it is an absolute necessity to use it as sparingly as possible.

When gold is deposited in a layer less than 1 $\mu$m thick, it is porous and does not withstand the corrosion test in which the relevant object is exposed for 24 hours to an atmosphere containing 1% by volume of $SO_2$ and 1% by volume of $H_2S$ and having a relative humidity at room temperature of about 90%. (Proposal 130 of the International Electrotechnical Committee.

SUMMARY OF THE INVENTION

According to the invention, it was now found that a thin layer of noble metal, not more than 0.1–2 $\mu$m thick, in combination with a layer of a mixture comprising hard electrically conducting particles in a binder of a pasty consistency, provides an excellent protection against corrosion and has in addition a low contact resistance between the members of the connecting means, which results in an extremely long service life.

The hard particles must have such a hardness that they are capable of penetrating through any local corroded areas on the subjacent noble metal. The minimum diameter of the particles must of course be not less than the maximum thickness of the oxide layer. The number of particles must be so high that the contact resistance becomes sufficiently low.

The binder with which the hard particles are mixed may be a grease, an oil or a wax, for example paraffin, vaseline, beeswax, wool grease, etc.

The hard conducting particles may consist of tungsten, molybdenum, ruthenium, stainless steel, ruthenium oxide, glassy carbon, tungsten bronzes and other metal oxides, bronzes etc. The concentration of the particles in the mixture is approximately 10–50% by weight.

It should be noted that the British Patent Specification No. 363,075 discloses a method of connecting aluminum bus bars, a proper electric contact being assured. To this end, the members to be connected must be smeared prior to use with a similar paste containing hard metal particles. This British Patent Specification, however, relates to much larger components than the connecting means for low-voltage engineering to which the present invention relates. In the latter case corrosion protection plays an important role and the gold layer is of primary importance.

A surprising feature of the invention is that when the connecting means are repeatedly connected and disconnected, the corrosion protection is not impaired and that the contact resistance progressively decreases.

The invention will now be further explained by way of example with reference to a concrete embodiment shown in the accompanying drawing.

Figure 1A:
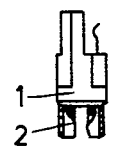
FIG. 1a is a side elevation, partly in cross section.
Figure 1B:
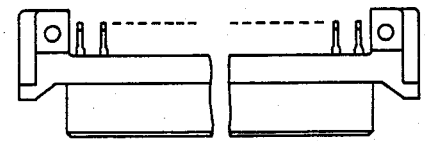
FIG. 1b is a front elevation.
Figure 1C:
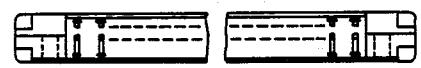
FIG. 1c is a top plane view of the female part of a multi-pole connector of the invention.
Figure 2A:
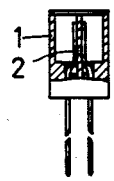
FIGS. 2a, 2b and 2c are the corresponding views of the corresponding male parts of this multi-pole connector.
Figure 2B:
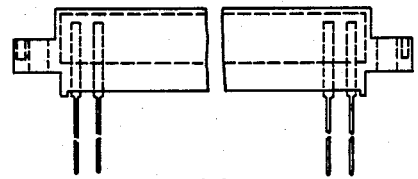
Figure 2C:

In the drawing, FIGS. 1 and 2 each show three elevational views of a socket and a plug, respectively, of a multi-pole connector. The body (1) of such a plug consists of a plastic material and the connecting members (2) consists of, for example, phosphor-bronze coated with a gold layer which, when the measures according to the invention are used, is, for example, only 0.9 $\mu$m thick.

The contact layers are coated with a layer of one of the two pastes, which contain the following components in the following ratios:
  (a) 1 g of vaseline, 0.5 g of ruthenium powder having a particle size less than 35 $\mu$m
  (b) 3 g of paraffin wax which is first dissolved at 90° in 10 g of white spirit. The solution is cooled until it forms a gel. Thereafter, 1 g of ruthenium powder (particle sizes less than 35 $\mu$m) is stirred into the gel until a homogeneous paste has been obtained.

The layers are applied by means of a brush or by dipping.

A number of these connectors are tested in the connected and in the disconnected states by means of the above-mentioned corrosion test, in which the plugs are exposed to an atmosphere which contains 1% by volume of $SO_2$ and 1% by volume of $H_2S$ and which has a relative humidity at room temperature of more than 90%.

The average contact resistance of the connectors before the test was 5.48 mOhm (minimum 4.77; maximum 6.99), while the bulk resistance was 3.2 mOhm. After having been tested for 24 hours, the average contact resistance of the connectors was 5.41 mOhm (minimum 4.62; maximum 6.94).

After 500 connecting and disconnecting operations of the connectors, the contact resistance had decreased to a value of approximately 4.5 mOhm.

For reasons of comparison a number of identical connector plugs, also coated with a 0.9 $\mu$m gold layer, were not coated with the above paste.

After the above-described corrosion test, the average contact resistance showed a considerably increase. 70% of the values of all connectors remained below 10 mOhm, 90% below 100 mOhm, but the remaining 10% showed extremes up to 2000, 4000 and 7500 mOhm. These values apply for disconnected connector members.

In the closed condition the result after the corrosion test was somewhat less unfavourable: 90% remains below 10 mOhm, 98% below 20 mOhm, whereas there was only one in excess of 5000 mOhm.

What is claimed is:

1. An electrical connector particularly suitable for use in low-voltage applications, said connector comprising an electrically insulating body and electrical conductors extending from said electrically insulating body characterized in that each of said electrical conductors comprises a substrate of a base metal readily oxidizable in air, an intermediate 0.1–2 $\mu$m thick gold layer on said substrate and an outer layer on said gold intermediate layer consisting of a mixture having a paste-like consistency of a binder selected from the group consisting of greases, oils and waxes and approximately 10–50% by weight of electrically conductive particles of a hardness in excess of any metal oxide capable of being formed by oxidation in air of said base metal and of a minimum diameter at least equal to the thickness of any layer capable of being formed by said oxide of said base metal.

2. The electrical connector of claim 1 wherein the base metal is a phosphor-bronze.

* * * * *